United States Patent
Chung et al.

(10) Patent No.: US 9,349,754 B2
(45) Date of Patent: May 24, 2016

(54) DISPLAY DEVICE AND METHOD FOR MANUFACTURING THE SAME

(71) Applicant: LG DISPLAY CO., LTD., Seoul (KR)

(72) Inventors: Jangkyun Chung, Paju-si (KR); Suwoong Lee, Paju-si (KR); Hwadong Han, Goyang-si (KR); Hoeyong Kim, Busan (KR); Kyungyun Kang, Jinju-si (KR); Hyunsoo Jang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/328,383

(22) Filed: Jul. 10, 2014

(65) Prior Publication Data

US 2015/0060867 A1    Mar. 5, 2015

(30) Foreign Application Priority Data

Aug. 30, 2013   (KR) .......................... 10-2013-0104389

(51) Int. Cl.
*H01L 27/14* (2006.01)
*H01L 27/12* (2006.01)

(52) U.S. Cl.
CPC .......... *H01L 27/124* (2013.01); *H01L 27/1248* (2013.01)

(58) Field of Classification Search
USPC .......... 257/72, 59, E27.13, E27.133, E27.134
See application file for complete search history.

(56) References Cited

U.S. PATENT DOCUMENTS

| | | | |
|---|---|---|---|
| 2008/0024693 A1* | 1/2008 | Lee et al. | 349/55 |
| 2008/0073649 A1* | 3/2008 | Kim | H01L 27/124 257/72 |
| 2010/0051957 A1* | 3/2010 | Kim et al. | 257/72 |
| 2011/0156995 A1* | 6/2011 | Choi | G02F 1/134363 345/92 |

* cited by examiner

*Primary Examiner* — Timor Karimy
(74) *Attorney, Agent, or Firm* — Dentons US LLP

(57) ABSTRACT

A display device including a substrate including a display area and a non-display area, wherein the non-display area comprises a gate metal line positioned on the substrate, a gate insulating layer insulating the gate metal layer, a data metal line positioned on the gate insulating layer, and two or more protective layers positioned in a region in which the gate metal line and the data metal line overlap above the data metal line.

6 Claims, 8 Drawing Sheets

DISPLAY DEVICE AND METHOD FOR MANUFACTURING THE SAME

This application claims the priority benefit of Korean Patent Application No. 10-2013-0104389 filed on Aug. 30, 2013, which is incorporated herein by reference for all purposes as if fully set forth herein.

BACKGROUND OF THE INVENTION

1. Field of the Invention

Embodiments of the disclosure relate to a display device. More particularly, the embodiments relate to a display device and a method for manufacturing the same.

2. Discussion of the Related Art

Recently, various flat display devices capable of reducing weight and volume, and shortcomings of cathode ray tubes (CRTs) have been developed. Examples of flat display devices include a liquid crystal display (LCD), a field emission display (FED), a plasma display panel (PDP), and an organic light emitting display device.

FIG. 1 is a plan view illustrating an organic light emitting display device as an example of a related art display device, and FIG. 2 is a cross-sectional view of area D in FIG. 1. Referring to FIG. 1, in the organic light emitting display device, an active region A/A in which an image is displayed is formed on a substrate 10, and data lines 25 in which a data signal from a data IC 20 is transmitted are arranged near the active region A/A, and gate lines 35 in which a gate signal from a gate IC 30 is transmitted are arranged to cross the data lines 25. Data power lines 40 arranged to be parallel to the data lines 25 and gate power lines 45 arranged to be parallel to the gate lines 35 cross to constitute a power source unit 60.

Here, as for a cross-section of the power source unit 60 in which the gate power line 45 and the data power cross, the gate power line 45 is positioned on the substrate 10, a gate insulating layer 37 is positioned on the gate power line 45, and the data power line 40 is sequentially stacked on the gate insulating layer 37. A passivation layer 50 is positioned on the data power line 40 to protect lower elements from the outside.

However, as illustrated in FIG. 2, while a follow-up process of the organic light emitting display device is performed, the power source unit 60 is frequently stabbed or scratched. Thus, the data power wiring 40 comes into contact with the gate power line 45, penetrating through the gate insulating layer 37, to generate a short-circuit, and thus, power is not supplied to cause defective panel driving.

SUMMARY OF THE INVENTION

An aspect of the invention provides a display device capable of preventing a short-circuit defect due to impact in a non-display area, and a method for manufacturing the same.

In one aspect, there is a display device including a substrate including a display area and a non-display area, wherein the non-display area comprises a gate metal line positioned on the substrate, a gate insulating layer insulating the gate metal layer, a data metal line positioned on the gate insulating layer, and at least two protective layers positioned in a region in which the gate metal line and the data metal line overlap above the data metal line.

In another aspect, there is a method for manufacturing a display device, the method comprises preparing a substrate including a display area and a non-display area, forming a gate metal line in the non-display area, forming a gate insulating layer on the gate metal line, forming a data metal line on the gate insulating layer, forming a protective layer on the data metal line, wherein the protective layer is formed in a region in which the gate metal line and the data metal line overlap.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
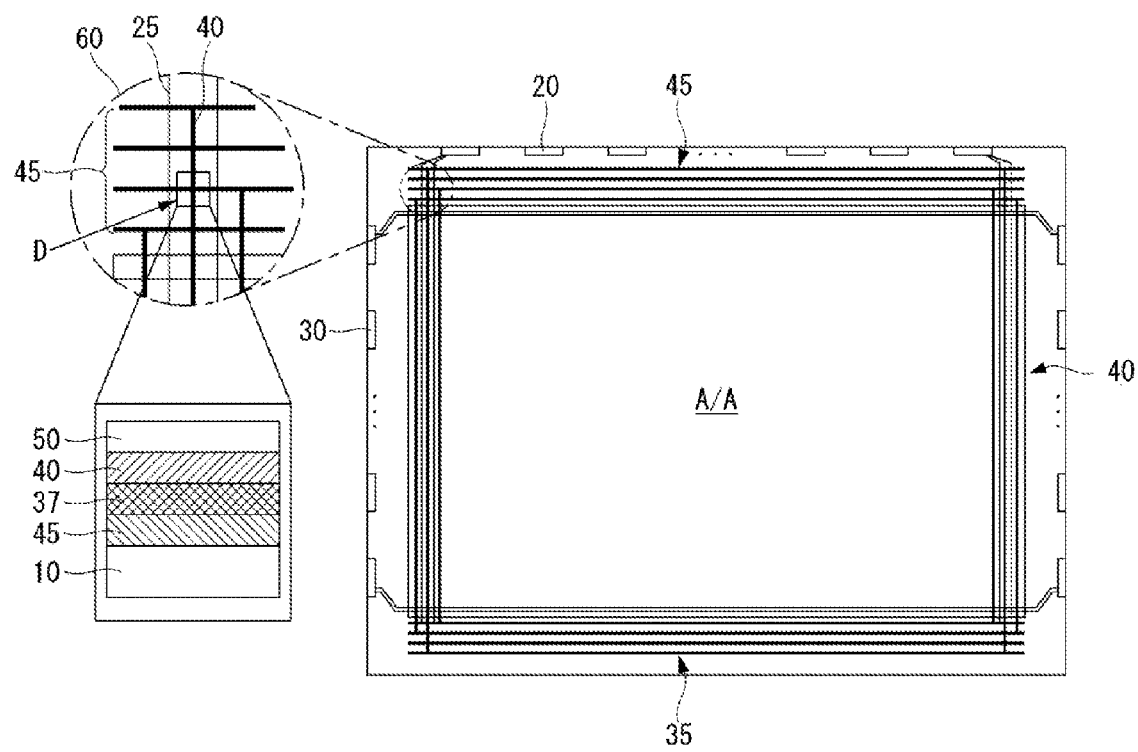
FIG. 1 is a plan view illustrating an organic light emitting display device as an example of a related art display device.
Figure 2:
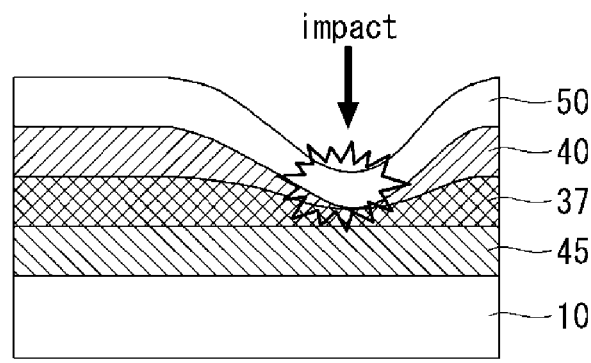
FIG. 2 is a cross-sectional view of area D in FIG. 1.
Figure 3:
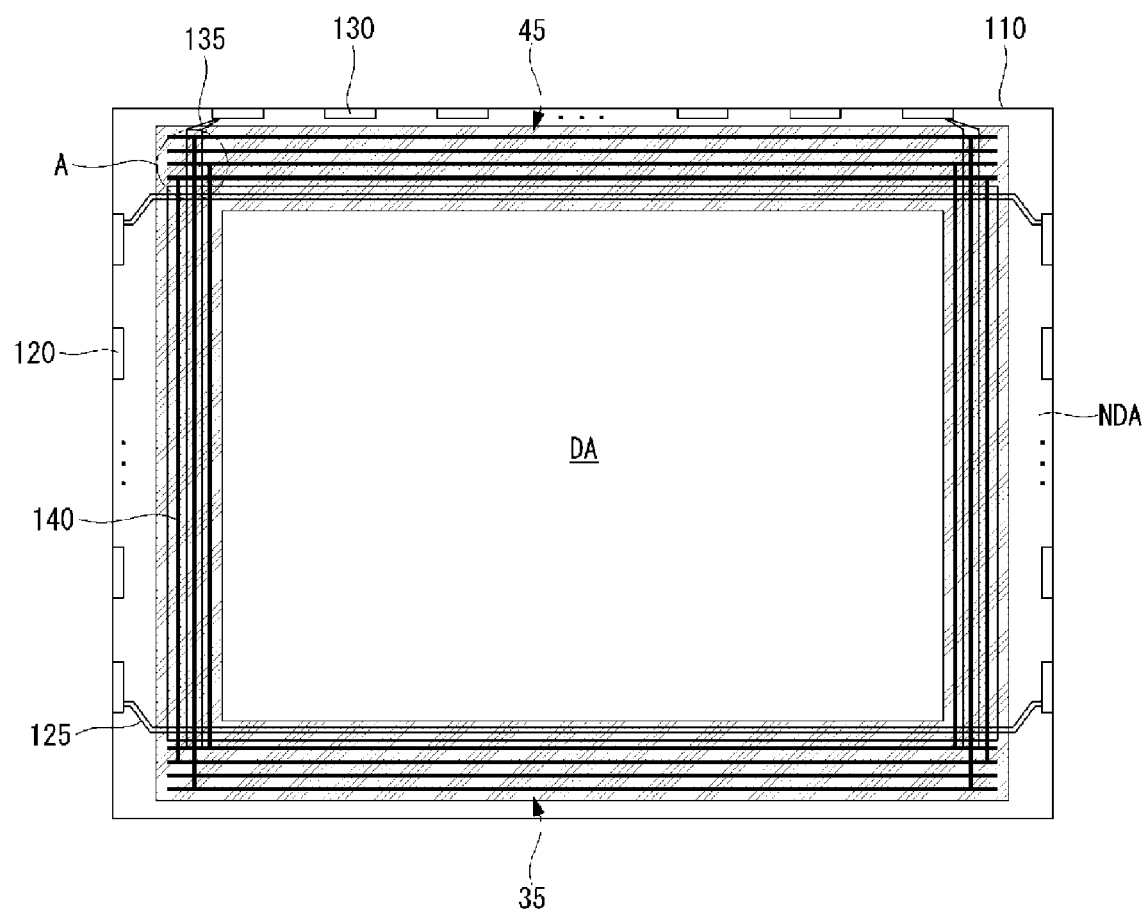
FIG. 3 is a plan view illustrating a display device according to an embodiment of the present invention.

FIG. 3 is a plan view illustrating a display device according to an embodiment of the present invention. Hereinafter, an organic light emitting display device will be described as an example of a display device of the present invention. However, the present invention is not limited thereto.

Referring to FIG. 3, a gate IC 120 applying a gate signal and a data IC 130 applying a data signal are positioned on a substrate 110, respectively. Gate lines 125 transferring a gate signal from the gate IC 120 are arranged in one direction of the substrate 110, and data lines 135 transferring a data signal from the data IC 130 are arranged to cross the gate lines 125.

A display area DA in which an image is displayed according to crossings between the gate lines 125 and the data lines 135 is defined, and an area other than the display area DA is defined as a non-display area (NDA). In the NDA, power lines applying power to the display area DA are arranged. The power lines include vertical power lines 140 arranged to cross the gate lines 125 and horizontal power lines 145 arranged to be parallel to the gate lines 125. A power source unit A is formed in an area in which the vertical power lines 140 and the horizontal power lines 145 cross. The horizontal power lines 145 and the gate lines 125 are formed of the same gate metal material to form gate metal lines GML, and the vertical power lines 140 and the data lines 135 are formed of the same data metal material to form data metal lines DML.

Meanwhile, in an area in which the gate metal line GML and the data metal line DML cross to overlap, a protective layer 164 including at least two or more layers is formed on the data metal line DML. The protective layer 165 prevents the gate metal line GML and the data metal line DML from coming into contact due to external impact in the area in which the gate metal line GML and the data metal line DML cross. In the present embodiment, it is disclosed that the protective layer 165 is formed in all of areas of the non-display area NDA in which metal lines cross. Namely, the protective layer 165 may be formed to surround the display area DA in the non-display area NDA.

Figure 4:
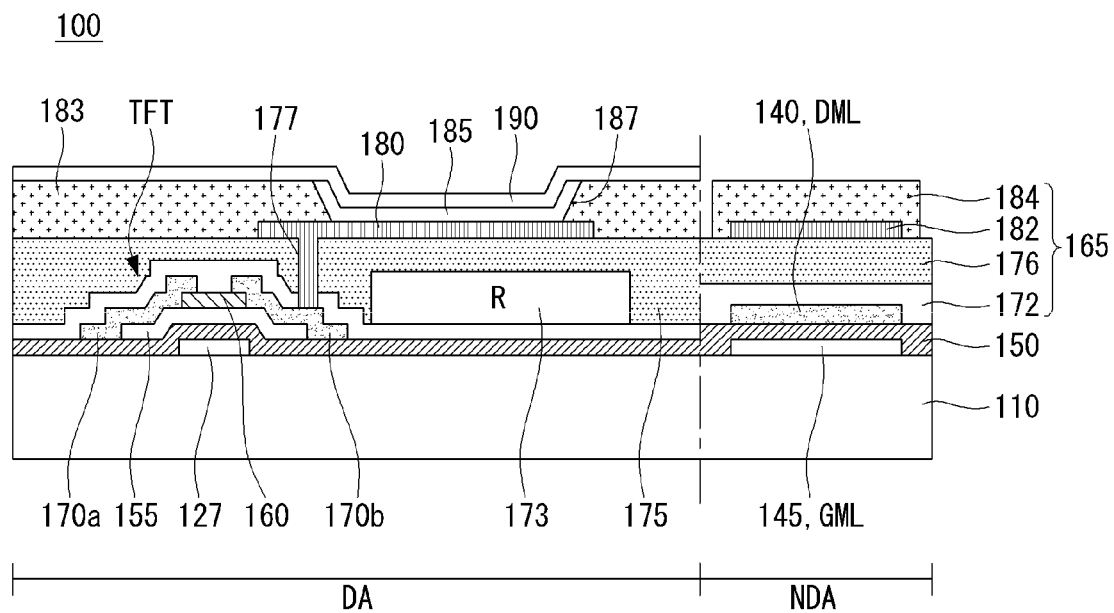
FIGS. 4 through 6 are cross-sectional views illustrating a display area and a non-display area of the display device of FIG. 3.
Figure 5:
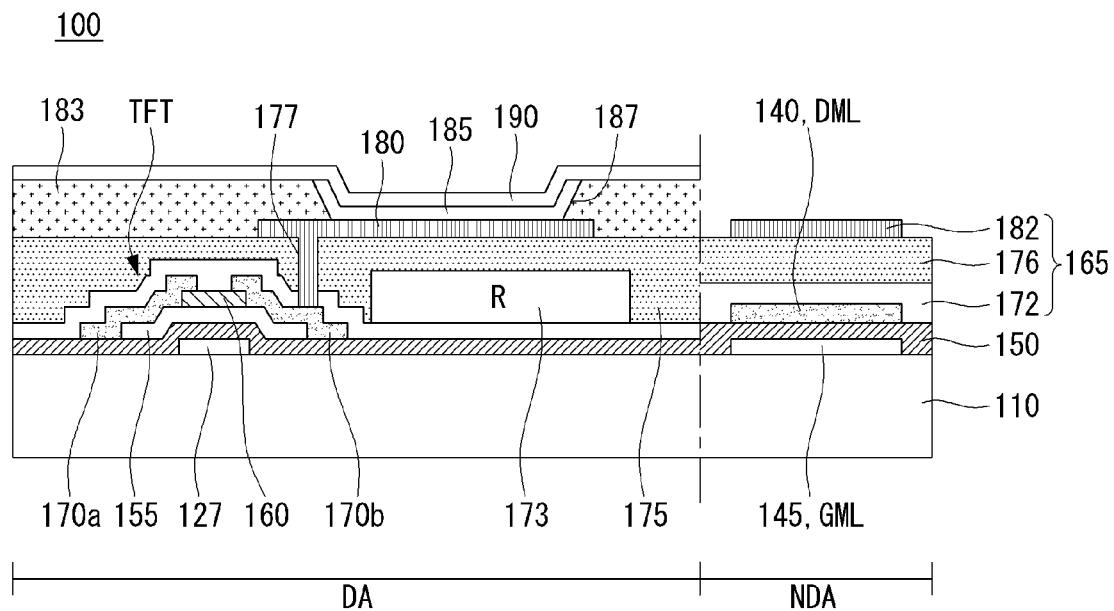
Figure 6:
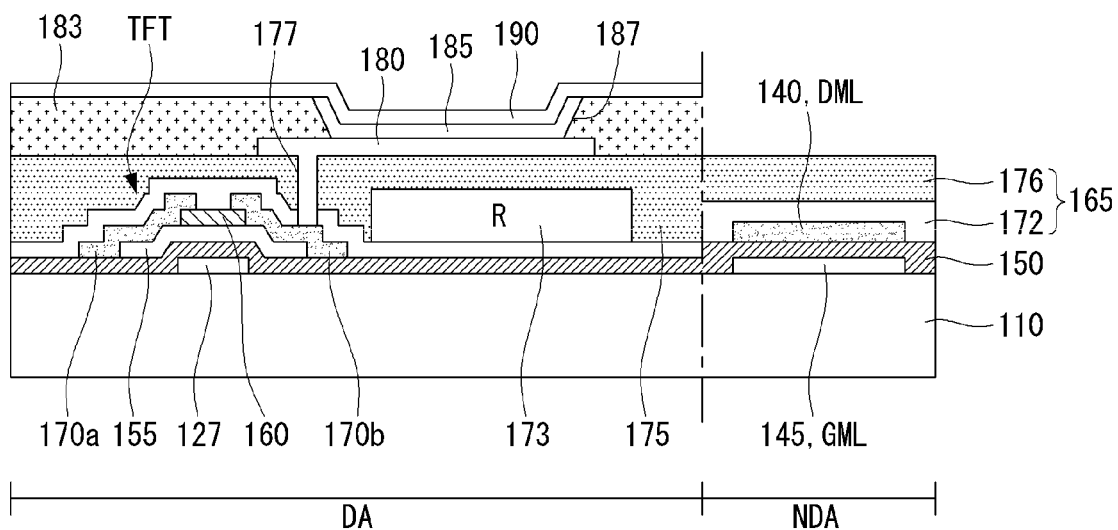

Hereinafter, the display device according to the embodiment of the present invention will be described in detail with reference to FIG. 4. FIGS. 4 through 6 are cross-sectional views illustrating the display area and the non-display area of the display device of FIG. 3.

Referring to FIG. 4, the display device 100 according to the embodiment of the present invention includes the substrate 110 in which the display area DA and the non-display area NDA are defined. A gate electrode 127 is positioned in the display area DA of the substrate 110, and a gate insulating layer 150 insulating the gate electrode 127 is positioned on the gate electrode 127. A semiconductor layer 155 is positioned in a region corresponding to the gate electrode 127 on the gate insulating layer 150, and an etch stopper 160 is positioned on the semiconductor layer 155. A source electrode 170a and a drain electrode 170b are positioned to be connected to both end portions of the semiconductor layer 155, constituting a thin film transistor (TFT).

A passivation layer 172 is positioned to protect the TFT, and a color filter 173 is positioned on the passivation layer 172. The color filter 173 is formed to correspond to a first electrode 180 as described hereinafter on the passivation layer 172 and white light emitted from a light emitting layer 185 later may transmit through the first electrode 180 and the color filter 173. The color filter 173 may represent at least one of red, green, and blue colors, and in the present embodiment, the color filter 173 is illustrated as a red color filter layer.

An overcoat layer 175 is positioned to cover the color filter 173, and the first electrode 180 connected to the drain electrode 170b of the TFT through a via hole 177 is positioned on the overcoat layer 175. A bank layer 183 having an opening 187 exposing a portion of the first electrode 180 is positioned on the first electrode 180, and the light emitting layer 185 is positioned on the exposed first electrode 180. A second electrode 190 is positioned on the light emitting layer 185.

Meanwhile, the non-display area NDA of the substrate 110 in which the horizontal power line 145 as a gate metal line GML and the vertical power line 140 as a data metal line DML cross will be described as follows. The horizontal power line 145 is positioned on the same layer as that of the gate electrode 127, and the gate insulating layer 150 insulating the horizontal power line 145 is positioned on the horizontal power line 145. The vertical power line 140 is positioned on the gate insulating layer 150 to cross the horizontal power line 145, and the protective layer 165 including a plurality of layers is positioned on the vertical power line 140.

The protective layer 165 illustrated in FIG. 4 has a four-layer stacked structure including a passivation layer 172 positioned on the vertical power line 140, an overcoat layer pattern 176 positioned on the passivation layer 172, a first electrode pattern 182 positioned on the overcoat layer pattern 176, and a bank layer pattern 184 positioned on the first electrode pattern 182. Here, the overcoat layer pattern 176 positioned on the passivation layer 172 is formed of a material identical to that of the overcoat layer 175 formed in the display area DA and patterned to be formed simultaneously during a process of forming the via hole 177. The first electrode pattern 182 positioned on the overcoat layer 175 is formed of a material identical to that of the first electrode 180 formed in the display area DA and patterned to be formed simultaneously during a process of patterning the first electrode 180. Also, the bank layer pattern 184 is formed of a material identical to that of the bank layer 183 formed in the display area DA and patterned to be formed simultaneously during the process of forming the opening 187 of the bank layer 183.

The foregoing protective layer 165 protects metal lines from external impact that may occur in the metal line region of the non-display area NDA and may be formed as a multi-layer including at least two or more layers. Unlike the protective layer 165 illustrated in FIG. 4, the protective layer 165 illustrated in FIG. 5 may have a triple-layer structure including the passivation layer 172, the overcoat layer pattern 176, and the first electrode pattern 182, without the bank layer pattern 184. Also, referring to FIG. 6, the protective layer 165 may have a dual-layer structure including the passivation layer 172 and the overcoat layer pattern 176.

Figure 7A:
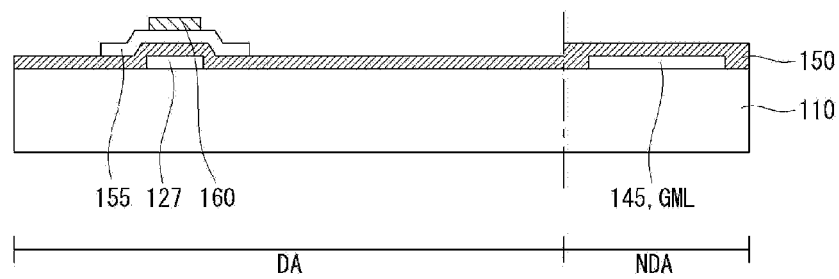
FIGS. 7A through 7C are cross-sectional views illustrating sequential process of a method for manufacturing a display device according to an embodiment of the present invention.
Figure 7B:
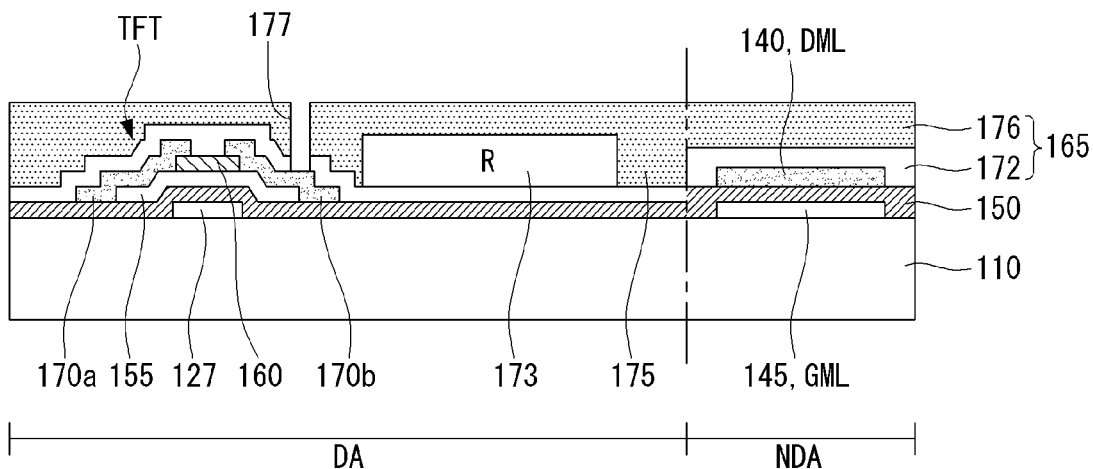
Figure 7C:
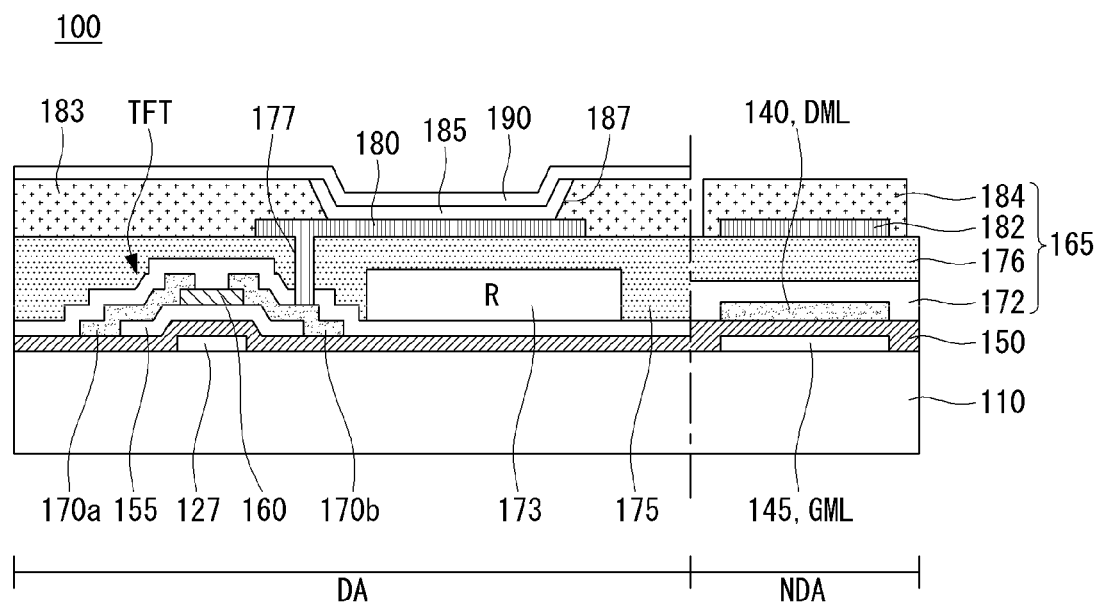
Figure 8:
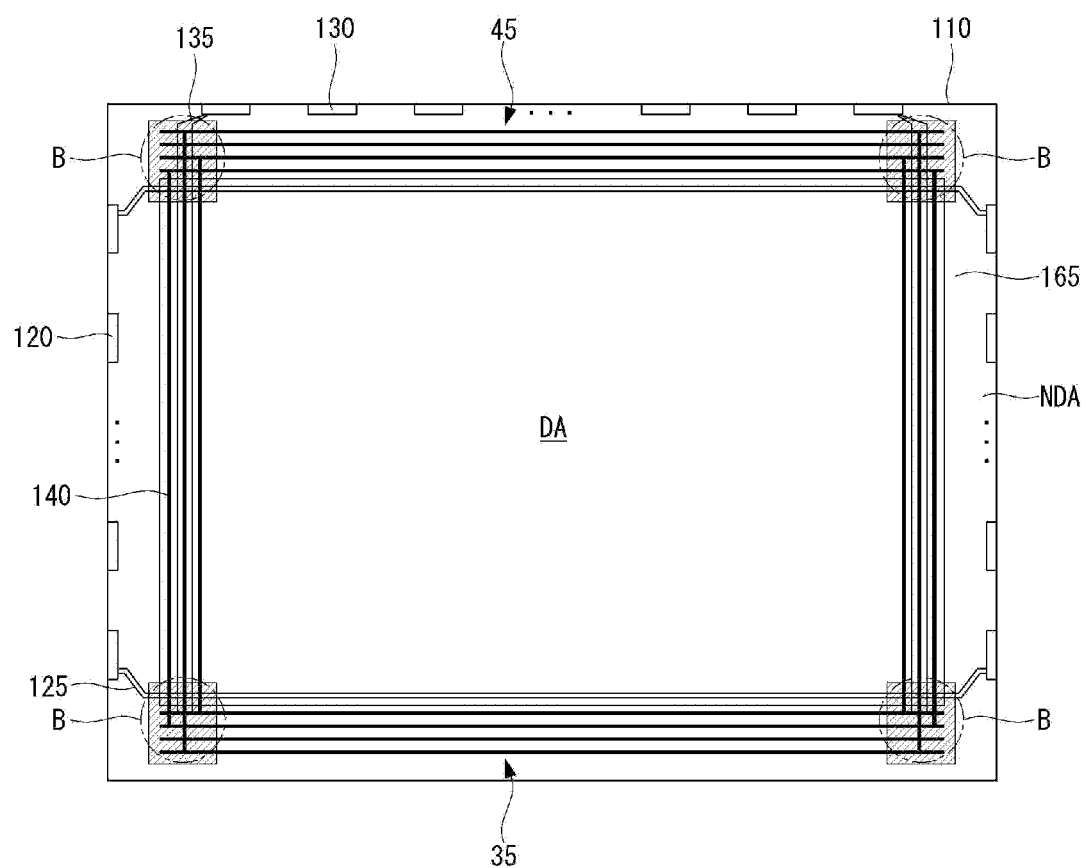
FIGS. 8 and 9 are plan views illustrating different positions of protective layers of the display device according to an embodiment of the present invention.
Figure 9:
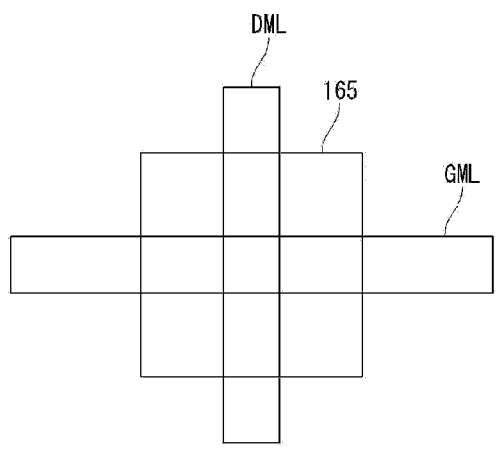

Hereinafter, a method for manufacturing a display device according to an embodiment of the present invention will be described. FIGS. 7A through 7C are cross-sectional views illustrating sequential process of a method for manufacturing a display device according to an embodiment of the present invention, and FIGS. 8 and 9 are plan views illustrating different positions of protective layers of the display device according to an embodiment of the present invention.

Referring to FIG. 7A, first, a first metal is stacked on a substrate 110 formed of glass, plastic, or a conductive material and patterned to form a gate electrode 127 in a display area DA and a horizontal power line 145 as a gate metal line GML in a non-display area NDA. Although not shown, a gate line is also formed simultaneously. The first metal may be a metal having low resistivity such as molybdenum (Mo), aluminum (Al), chromium (Cr), gold (Au), titanium (Ti), nickel (Ni), copper (Cu), or an alloy thereof.

Subsequently, a gate insulating layer 150 is formed on the substrate 110 with the gate electrode 127 and the horizontal power line 145 formed thereon. The gate insulating layer 150 may be formed of a silicon oxide (SiOx), a silicon nitride (SiNx), or a stacked structure of a silicon oxide (SiOx) and a silicon nitride (SiNx). The gate insulating layer 150 may be formed in both of the display area DA and the non-display area NDA of the substrate 110.

Thereafter, an amorphous silicon is deposited on the substrate 110 with the gate insulating layer 150 formed thereon and crystallized to form a polycrystalline silicon, and the polycrystalline silicon is patterned to form a semiconductor layer 155. Subsequently, a silicon oxide (SiOx) or a silicon nitride (SiNx) is deposited on the entire surface of the substrate 110 including the semiconductor layer 155 and patterned to form an etch stopper 160 on the semiconductor layer 155 of the display area DA of the substrate 110.

Referring to FIG. 7B, a second metal is stacked on the substrate 110 with the etch stopper 160 formed thereon and patterned to form a source electrode 170a and a drain electrode 170b in the display area DA and a vertical power line 140 in the non-display area (NDA). Although not shown, a data line may also be simultaneously formed. The second metal may be a metal having low resistivity, and, for example, molybdenum (Mo), aluminum (Al), chromium (Cr), gold (Au), titanium (Ti), nickel (Ni), copper (Cu), or an alloy thereof, may be used as the second metal. The second metal may be formed as a single layer or multi-layer including molybdenum/aluminum/molybdenum (Mo/Al/Mo) or titanium/aluminum/titanium (Ti/Al/Ti).

Thereafter, a passivation layer 172 is formed on the substrate 110 with the source electrode 170a, the drain electrode 170b, and the vertical power line 140 formed thereon. The passivation layer 172 may be formed of formed of a silicon oxide (SiOx), a silicon nitride (SiNx), or a stacked structure of a silicon oxide (SiOx) and a silicon nitride (SiNx). Also, the passivation layer 172 is formed in both of the display area DA and the non-display area NDA. Subsequently, a color filter 173 is formed on the passivation layer 172 in the display area DA. The color filter 173 is formed in a position corresponding to a light emitting layer 185 as described hereinafter to allow white light emitted from the light emitting layer 185 to be output as red, green, or blue color through the color filter 173.

Thereafter, an organic substance is coated on the entire surface of the substrate 110 with the color filter 173 formed thereon, and patterned to form an overcoat layer 175 including a via hole 177 formed therein and an overcoat layer pattern 176 in the non-display area NDA. The overcoat layer 175 serves to alleviate a step in a lower structure, and may be formed of an organic substance such as polyimide, benzocyclobutene series resin, acrylate, or the like, or an inorganic substance such as spin on glass (SOG) that coats a silicon oxide in a liquid form and curing the same.

Subsequently, referring to FIG. 7C, a transparent conductive material is deposited on the substrate 110 with the overcoat layer 175 and the overcoat layer pattern 176 formed thereon, and patterned to form a first electrode 180 connected to any one of the source electrode 170a and the drain electrode 170b in the display area DA. Simultaneously, a first electrode pattern 182 is formed on the overcoat layer pattern 176 in the non-display area NDA. The first electrode 180 and the first electrode pattern 182 may be formed as transparent conductive layers such as indium tin oxide (ITO) or indium zinc oxide (IZO).

Subsequently, an organic substance is coated on the substrate 110 with the first electrode 180 and the first electrode pattern 182 formed thereon, and patterned to form a bank layer 183 having an opening 187 exposing the first electrode 180 in the display area DA. Simultaneously, a bank layer pattern 184 is formed on the first electrode pattern 182 in the non-display area NDA. The bank layer 183 and the bank layer pattern 184 may be formed of an organic substance such as polyimide, benzocyclobutene series resin, acrylate, or the like. Thereafter, the bank layer 183 is etched to form the opening 187 exposing a portion of the first electrode 180.

Accordingly, a protective layer 165 including the passivation layer 172, the overcoat layer pattern 176, the first electrode pattern 182, and the bank layer pattern 184 being stacked may be formed in the region in which the gate metal line GML and the data metal line DML cross. Referring back to FIG. 3, the protective layer 165 in the non-display area NDA surrounds the display area DA, and overlaps with the region in which the data line 135, the gate line 125, the horizontal power line 145, and the vertical power line 140 are arranged. Meanwhile, referring to FIG. 8, the protective layer 165 may also be formed in the region B in which at least the horizontal power line 145 and the vertical power line 140 or the gate line 125 and the data line 135 cross. Also, as illustrated in FIG. 9, the protective layer 165 may be formed at every intersection in which one gate metal line GML and one data metal line DML cross. In this case, the protective layer 165 may be formed to have a size sufficient for covering the planar region in which at least the gate metal line GML and the data metal line DML cross, or may be formed to have a size sufficient for covering at least two or more regions in which the gate metal line GML and the data metal line DML cross.

As described above, the protective layer 165 is formed in the region in which the gate metal line GML including the gate line 125 and the horizontal power line 145 and the data metal line DML including the data line 135 and the vertical power line 140 cross to overlap with each other. Thus, a defect generated as the gate metal line GML and the data metal line DML come into contact due to physical damage so as to be shorted during a process may be prevented.

Meanwhile, the light emitting layer 185 is formed within the opening 187 exposing the first electrode 180. The light emitting layer 185 may be formed of an organic substance emitting white light, thus emitting white light. The light emitting layer 185 is formed on the first electrode 180 in every subpixel. Thus, white light emitted by the light emitting layer 185 passes through the foregoing color filter 173 to implement red, green, and blue light. Also, one or more of an electron injection layer EIL and an electron transport layer ETL may be further formed between the light emitting layer 185 and the first electrode 180 in order to allow electrons to easily move to the light emitting layer 185. Also, one or more of a hole injection layer HIL and a hole transport layer (HTL) may be further formed between the light emitting layer 185 and a second electrode 190 in order to allow holes to be easily move to the light emitting layer 185. The light emitting layer 185 may be formed by using vacuum deposition, laser heat transfer, screen printing, ink-jet method, and the like. Subsequently, the second electrode 190 is formed on the substrate 110 including the light emitting layer 185 formed thereon. The second electrode 190 may be formed of a metal having a low work function, such as silver (Ag), magnesium (Mg), calcium (Ca), or the like.

As described above, in the display device according to an embodiment of the present invention, since the protective layer is formed in the region in which the gate metal line and the data metal line cross, a defect generated as the gate metal line GML and the data metal line DML come into contact due to physical damage so as to be shorted during a process may be prevented.

Meanwhile, as the foregoing display device, an organic light emitting display device has been described as an example. However, the present invention may also be applied to a liquid crystal display (LCD) having a non-display area designed to be similar to that of the organic light emitting display device.

Figure 10:
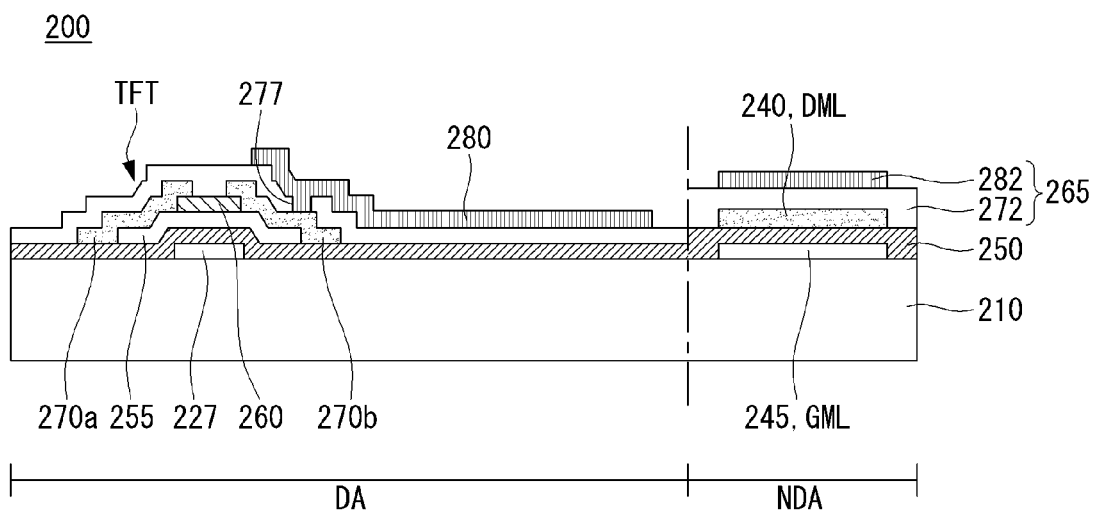
FIG. 10 is a cross-sectional view illustrating a liquid crystal display (LCD) device according to an embodiment of the present invention.

FIG. 10 is a cross-sectional view illustrating a liquid crystal display (LCD) device according to an embodiment of the present invention. Referring to FIG. 10, a display device 200 according to the embodiment of the present invention includes a substrate 210 on which a display area DA and a non-display area NDA are defined. A gate electrode 227 is positioned in the display area DA of the substrate 210, and a gate insulating layer 250 is positioned on the gate electrode 227 to insulate the gate electrode 227. A semiconductor layer 255 is positioned in a region corresponding to the gate electrode 227 on the gate insulating layer 250, and an etch stopper 260 is positioned on the semiconductor layer 255. A source electrode 270a and a drain electrode 270b are positioned to be connected to both end portions of the semiconductor layer 255, forming a TFT. A passivation layer 272 protecting the TFT is positioned, and a first electrode 280 is positioned on the passivation layer 272 and connected to the drain electrode 270b of the TFT through a via hole 277

Meanwhile, the non-display area NDA of the substrate 210 in which a horizontal power line 245 as a gate metal line GML and a vertical power line 240 as a data metal line DML cross will be described. The horizontal power line 245 is positioned on a layer on which the gate electrode 227 is formed, and a gate insulating layer 250 insulating the horizontal power line 245 is positioned on the horizontal power line 245. The vertical power line 240 is positioned on the gate insulating layer 250 to cross the horizontal power line 245, and a protective layer 265 formed as a multi-layer is positioned on the vertical power line 240.

The protective layer 265 has a two-layer stacked structure including a passivation layer 272 positioned on the vertical power line 240 and a first electrode pattern 282 positioned on the passivation layer 272. Here, the first electrode pattern 282 positioned on the passivation layer 272 is formed of a material identical to that of the first electrode 280 formed in the display area DA and simultaneously patterned to be formed during a process of patterning the first electrode 180.

The foregoing protective layer 265 is formed as a multi-layer including two or more layers in region metal lines cross in the non-display area NDA. Thus, in the display device according to the embodiment of the present invention, since the protective layer is formed in the region in which the gate metal line and the data metal line cross, a defect generated as the gate metal line GML and the data metal line DML come into contact due to physical damage so as to be shorted during a process may be prevented.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device including a substrate having a display area and a non-display area, wherein the non-display area comprises:
    a gate metal line positioned on the substrate;
    a gate insulating layer insulating the gate metal line;
    a data metal line positioned on the gate insulating layer; and
    at least two protective layers positioned in a region in which the gate metal line and the data metal line overlap each other on the data metal line in the non-display area,
 wherein the display area comprises:
    a thin film transistor (TFT) positioned on the substrate;
    a passivation layer positioned on the TFT;
    a first electrode positioned on the passivation layer,
    an overcoat layer positioned between the passivation layer and the first electrode;
    a bank layer exposing the first electrode on the overcoat layer;
    a light emitting layer positioned on the exposed first electrode; and
    a second electrode positioned on the light emitting layer and the bank layer.

2. The display device of claim 1, wherein the gate metal line is a horizontal power line, and the data metal line is a vertical power line.

3. The display device of claim 1, wherein the gate metal line is a gate line, and the data metal line is a data line and a common power line.

4. The display device of claim 1, wherein a planar area of the protective layers is greater than a region in which the gate metal line and the data metal line overlap.

5. The display device of claim 1, wherein the protective layers include a first electrode pattern and the passivation layer, and the first electrode pattern is positioned on a layer on which the first electrode is positioned.

6. The display device of claim 1, wherein the protective layers include a passivation layer, an overcoat layer pattern, a first electrode pattern, and a bank layer pattern,
    wherein the overcoat layer pattern is positioned on a layer on which the overcoat layer is positioned, the first electrode pattern is positioned on a layer on which the first electrode is positioned, and the bank layer pattern is positioned on a layer on which the bank layer is positioned.

* * * * *